United States Patent
Braun et al.

(10) Patent No.: US 6,877,897 B2
(45) Date of Patent: Apr. 12, 2005

(54) METHOD FOR DETERMINING THE TEMPERATURE OF A MEMORY CELL FROM TRANSISTOR THRESHOLD VOLTAGE

(75) Inventors: Jens Braun, München (DE); Detlev Richter, München (DE); Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 330 days.

(21) Appl. No.: 10/060,445

(22) Filed: Jan. 30, 2002

(65) Prior Publication Data

US 2002/0101906 A1 Aug. 1, 2002

(30) Foreign Application Priority Data

Jan. 30, 2001 (DE) .......................... 101 03 991

(51) Int. Cl.[7] .............. G01K 7/01; G11C 7/04; H01L 27/105
(52) U.S. Cl. .............. 374/178; 374/152; 365/212
(58) Field of Search ............... 374/178, 152, 374/141; 327/512, 513; 365/210, 211, 212; 257/467, 470

(56) References Cited

U.S. PATENT DOCUMENTS

| | | | | |
|---|---|---|---|---|
| 3,950,991 A | * | 4/1976 | Grass | 327/512 |
| 4,121,461 A | * | 10/1978 | Butler et al. | 374/178 |
| 4,924,212 A | * | 5/1990 | Fruhauf et al. | 327/512 |
| 5,873,053 A | * | 2/1999 | Pricer et al. | 327/513 |
| 6,130,442 A | | 10/2000 | Di Zenzo et al. | |

OTHER PUBLICATIONS

Bonhaus, Joerg et al., English Abstract of DE 19829716 A1, (EPO, published Jan. 20, 2000).*

* cited by examiner

Primary Examiner—Gail Verbitsky
Assistant Examiner—Stanley J. Pruchnic, Jr.
(74) Attorney, Agent, or Firm—Laurence A. Greenberg; Werner H. Stemer; Ralph E. Locher

(57) ABSTRACT

The temperature of a semiconductor component is determined by way of a memory cell that includes a transistor and a capacitor. To that end, a signal is determined in dependence on a threshold voltage of the transistor and a value for the temperature of the transistor is determined in dependence on the signal.

3 Claims, 1 Drawing Sheet

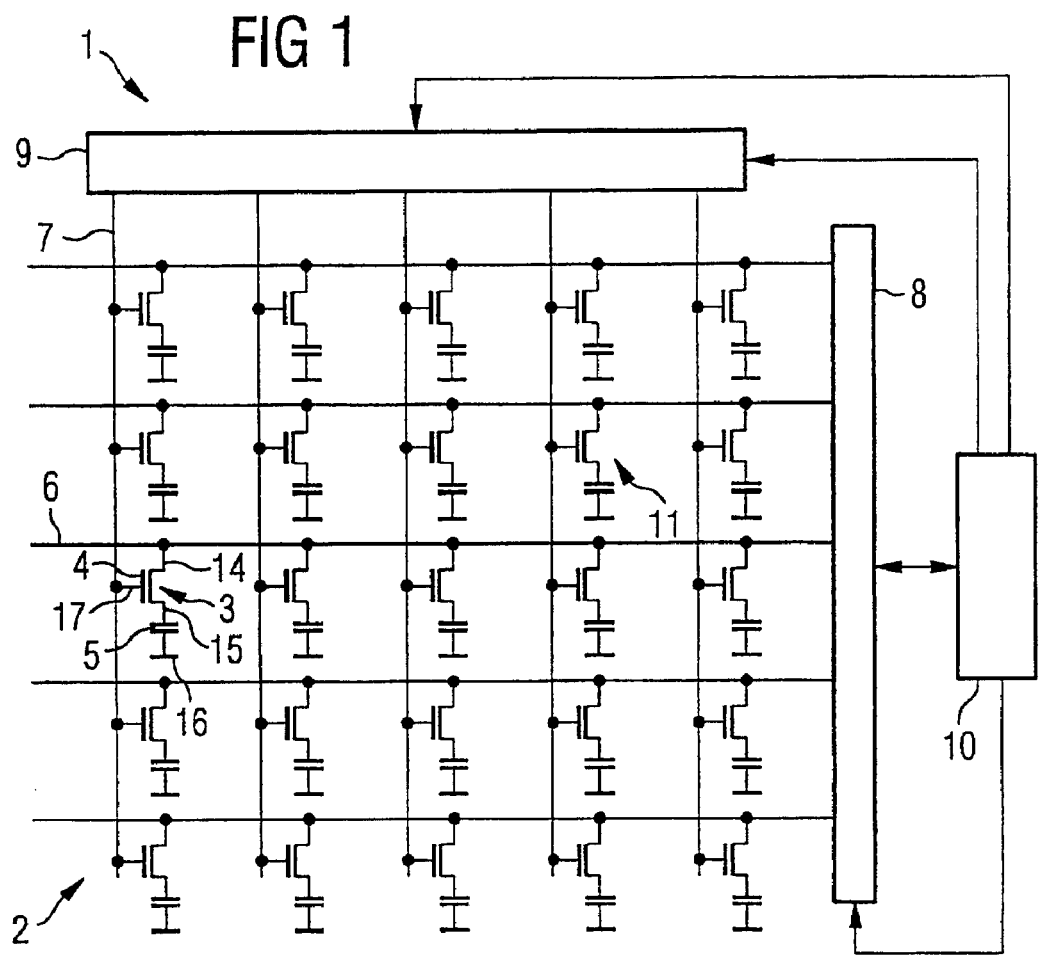
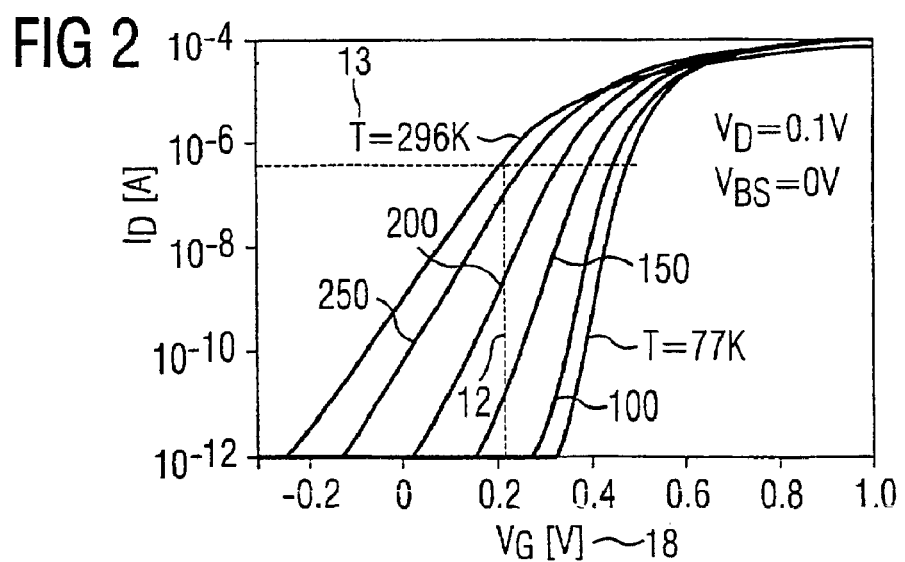

METHOD FOR DETERMINING THE TEMPERATURE OF A MEMORY CELL FROM TRANSISTOR THRESHOLD VOLTAGE

BACKGROUND OF THE INVENTION

Field of the Invention

The present invention relates to a method for determining the temperature of a semiconductor component.

The definition of the defect behavior of a semiconductor component can be determined in a simple manner, for example, in an analysis or a production test by means of the failure of the semiconductor component. As a rule, however, it is very complicated to perform an exact spatial defect localization for complex semiconductor components. This is due to the fact, for example, that structures of the semiconductor components and metal wiring layers are concealed by higher metal layers, so that the surface of a semiconductor component cannot be analyzed directly. The localization of defects becomes particularly complicated for semiconductor components which are already packaged and have to be analyzed quickly and in detail after a failure of a semiconductor component application.

A large class of defects is associated with increased local current consumption, the maximum permissible currents being exceeded, which may be caused for example by local short circuits. This type of defect can be demonstrated for example by means of local temperature measurement. The multiplicity of metal layers which may be arranged above the heat source often make it impossible to localize the short circuit.

By way of example, the so-called hot spot temperature measurement is known from the prior art. To that end, a liquid crystal is applied to the semiconductor component and a phase transition of the liquid crystal is detected. A good temperature resolution is made possible in that case. What is problematic, however, is that usually only entire wafers can be analyzed and the method cannot be applied to individual semiconductor chips. A low spatial resolution on account of the major heat conduction in metal wiring planes and contamination of the semiconductor component are also disadvantageous.

Furthermore, it is known to carry out an infrared emission measurement for detecting high current densities. It is problematic in that case, however, that it is likewise only the wafer as a whole that can be analyzed; a module cannot be analyzed separately. Moreover, the measurement can be effected only in a special measurement location with a special measurement apparatus. Furthermore, the measurement is usually carried out on the rear side of the semiconductor substrate, as a result of which the spatial resolution of the measurement is considerably reduced. It is disadvantageous, moreover, that the relationship between thermal emission or the temperature and a short circuit of a metal interconnect is very indirect.

SUMMARY OF THE INVENTION

It is accordingly an object of the invention to provide a method which can be used to measure the temperature of a semiconductor component, which overcomes the above-mentioned disadvantages of the heretofore-known devices and methods of this general type and which provides for improved local resolution.

With the foregoing and other objects in view there is provided, in accordance with the invention, a method for determining a temperature of a semiconductor component with a memory cell having a transistor and a capacitor, which comprises:

determining a threshold voltage of the transistor and generating a signal in dependence on the threshold voltage of the transistor; and determining a value for a temperature of the transistor in dependence on the signal.

The object is achieved according to the invention by means of a method for determining the temperature of a semiconductor component by means of a memory cell which comprises a transistor and a capacitor, wherein a signal is determined in a manner dependent on a threshold voltage of the transistor, and a value for the temperature of the transistor is determined in a manner dependent on the signal.

The method according to the invention enables a high local resolution since transistors can be arranged in direct spatial proximity to the short circuits to be measured and hence to the temperature increase to be measured. Furthermore, a cell array comprising memory cells enables an extensive measurement of the temperature, temperature distribution and temperature gradients of a semiconductor component. This makes it possible, for example, to use the memory cell of a memory comprising selection transistor and storage capacitor for a temperature measurement. Averaging over a plurality of values for determining the temperature is additionally made possible.

The method specified is advantageously possible with a component that is unopened and not reprepared.

In accordance with an added feature of the invention, the method according to the invention provides that a first signal is determined in a manner dependent on a first threshold voltage of the transistor and a first value for a first temperature of the transistor is determined in a manner dependent on the first signal at a first instant;

a second signal is determined in a manner dependent on a second threshold voltage of the transistor at a second instant and a second value for a second temperature of the transistor is defined at the second instant by means of the first signal, the second signal, the first value for the first temperature and a temperature coefficient.

This method variant advantageously enables a differential temperature definition, in which case the temperature at the first instant can be used as reference temperature in the definition of the second temperature at the second instant. As a result, it is possible to define the second temperature for the most part independently of the actual properties of the transistor. This is made possible by virtue of the fact that the properties of the transistor and of a measurement apparatus influence the first signal and the second signal.

In accordance with an additional feature of the invention, the method provides that the transistor has a controlled path between a source terminal and a drain terminal, the controlled path connecting a bit line to an electrode of a capacitor, and a first gate voltage is applied to a gate terminal of the transistor, the capacitor being charged with a first quantity of charge flowing through the transistor, and a value for the temperature of the transistor is determined by means of the first quantity of charge.

This method makes it possible to define a value for the temperature of a semiconductor component, it not being necessary for both the source terminal and the drain terminal of the transistor to be directly accessible for a measurement. The capacitor is used as a charge store.

In accordance with an additional feature of the invention, firstly a defined charge state is set in the capacitor; afterward a bit line voltage is applied to the bit line; a first value for a gate voltage is applied to the gate terminal of the transistor for a period of time, the capacitor being charged with the first quantity of charge; and the charge state of the capacitor is determined by means of a read-out circuit.

A further refinement of the method according to the invention provides that different values for the gate voltage are applied to the gate terminal and a definition value is determined for the gate voltage, in the case of which value, for a smaller value of the gate voltage—than the definition value—a first binary state of the memory cell is determined and, for a larger value of the gate voltage—than the definition value—a second binary state of the memory cell is determined by means of the read-out circuit, said second binary state having a value opposite to the first binary state.

This method makes it possible to determine a definition value for the gate voltage, which value is linked to the threshold voltage of the transistor by means of its physical properties and can change in accordance with a change in temperature of the transistor. Consequently, it is possible to determine a value for the temperature of the transistor using the definition value for the gate voltage.

In accordance with a further advantageous refinement of the method according to the invention a first definition value for the gate voltage is determined for a first value of a first temperature of the transistor and a second definition value for the gate voltage is determined for a second temperature of the transistor, a value for the second temperature being determined by means of the first temperature, the first definition value and the second definition value.

Other features which are considered as characteristic for the invention are set forth in the appended claims.

Although the invention is illustrated and described herein as embodied in a method for determining the temperature of a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic block diagram of a semiconductor component with a memory cell array; and FIG. 2 is a graph plotting a temperature-dependent family of characteristic curves of a field-effect transistor.

DESCRIPTION OF THE PREFERRED EMBODIMENTS

Referring now to the figures of the drawing in detail and first, particularly, to FIG. 1 thereof, there is seen a semiconductor component 1. The semiconductor component 1 comprises a memory cell field or memory cell array 2. A first memory cell 3 is arranged in the memory cell array 2. The first memory cell 3 comprises a transistor 4 and a capacitor 5. The transistor 4 has a source terminal 14, a drain terminal 15 and a gate terminal 17. The drain terminal 15 is connected to an electrode of the capacitor 5. The second electrode of the capacitor 5 is connected to a reference-ground potential 16. Furthermore, the memory cell array comprises a bit line 6 and a word line 7, which cross at the first memory cell 3. The source terminal 14 of the transistor 4 is connected to the bit line 6 and the gate terminal 17 is connected to the word line 7. The bit line 6 is connected to a bit line decoder 8 and the word line 7 is connected to a word line decoder 9. The bit line decoder 8 and the word line decoder 9 are connected to an processing unit, referred to as an execution unit 10 in this text. The execution unit 10 serves for controlling the bit line decoder 8 and the word line decoder 9. A second memory cell 11 is identified in the memory cell array 2.

A method for operating the semiconductor component illustrated in FIG. 1 comprises, for example, methods for operating a DRAM (dynamic random access memory) which are known from the prior art. In order, for example, to write an information item to the first memory cell 3, the execution unit 10 drives the bit line decoder 8 and the word line decoder 9. By means of the bit line decoder 8, a bit line voltage is applied to the bit line 6. By means of the word line decoder 9, the word line 7 is selected and the transistor 4 is opened. As a result, charge flows from the bit line 6 through the transistor 4 into the capacitor 5 and a corresponding binary value is stored in the capacitor 5. In order to enable reliable writing of a binary value to the memory cell 3, it is necessary for the word line voltage present on the word line 7 to lie above the threshold voltage of the transistor 4, so that the transistor is switched on.

In order to read out the information stored in the first memory cell 3, the transistor 4 is opened by means of a suitable word line voltage on the word line 7. The charge stored in the capacitor 5 flows through the transistor 4 into the bit line 6. The bit line decoder 8 detects the charge flowing from the capacitor 5 onto the bit line 6, evaluates the charge, and outputs a binary value corresponding to the charge. The binary value is processed further in the execution unit 10, for example.

FIG. 2 illustrates a temperature-dependent family of input characteristic curves of an n-channel field-effect transistor. The voltage applied to the gate terminal is plotted on the horizontal axis and the corresponding source-drain current is represented on the vertical axis. Input characteristic curves for 77 K, 100 K, 150 K, 200 K, 250 K and 296 K are represented in the drawing region of the graph. The threshold voltage 12 for a first temperature 13 is about 220 mV.

With regard to FIG. 1, each selection transistor has a temperature-dependent threshold voltage. By measuring this threshold voltage, it is possible to determine a temperature value for each memory cell. As a result, the entire memory cell array 2 can be measured with high spatial resolution. In this case, it is advantageous that no additional sensors are required for measuring the temperature. A very high spatial resolution is made possible, the local resolution being prescribed by the size of a memory cell. Furthermore, it is advantageous that measured temperature values can be determined directly at the surface of the semiconductor substrate and do not have to be performed on metal layers that are significantly farther away. Furthermore, it is advantageous that the temperature measurement can be effected on a standard module without special preparation in respect of apparatus. Moreover, the temperature measurement is non-destructive and the large number of temperature measuring sensors which is prescribed by the large number of memory cells allows additional averaging of the temperature value.

A method for measuring the temperature firstly stores a defined voltage value in each memory cell to be examined. In this case, by way of example, the defined voltage value is written to the first memory cell 3. In order to simplify the further explanations, the first memory cell 3 will be described as an example for further memory cells. A defined bit line voltage is subsequently applied to the bit line 6. A first value for a gate voltage is selected and the gate voltage is applied to the gate terminal 17 of the transistor 3 by means of the word line 7 and the word line decoder 9 for a first period of time. The capacitor 5 is thereby charged with a first quantity of charge. The charge state of the capacitor 5 is subsequently determined by the read-out from the first memory cell 3. Since, in a DRAM, two binary values can usually be stored in a memory cell, the bit line decoder 8 decides which of the two binary states is stored in the memory cell 3 on the basis of the quantity of charge that is fed to the decoder via the bit line 6. Further values for the gate voltage are then selected and the method described above is carried out repeatedly for these gate voltages. In this case, a limit value is determined for the gate voltage, in the case of which limit value, for smaller values of the gate voltage, a first binary state of the memory cell is measured and, for larger values of the gate voltage, a second binary state of the memory cell is measured by the bit line decoder 8.

The charge stored in the memory cell 3 is dependent on the value of the gate voltage, since the gate voltage determines the degree to which the transistor is open. Since the capacitor is charged by the transistor for a defined period of time, the charge state stored in the transistor assumes either a value which can be assigned to the first binary state or a value which can be assigned to the second binary state.

Each transistor arranged in the memory cell array 2 can be calibrated individually. This can be done, for instance, in such a way that a measurement is carried out at a known constant temperature T0, which, for example, is present immediately after the supply voltage has been switched on or is reached once all the circuits that are not required for this measurement have been switched off. The result of this measurement is stored and used as reference value. In this case, the reference value is a limit value for the gate voltage which can be assigned to the first temperature T0. Any asymmetries in the sense amplifier of the bit line decoder 8 or doping fluctuations in the transistor are automatically taken concomitantly into account by means of this calibration step. If the transistor heats up during the operation of the memory cell, for example as a result of a malfunction, then the temperature of the transistor can be determined by determining a second limit value for the gate voltage with respect to the unknown temperature. The unknown temperature T is then defined from the calibration temperature T0, the calibration limit value $V_{limit0}$ and the second limit value $V_{limit}$ and also a temperature coefficient A. $T=T_0+(V_{limit0}-V_{limit})/A$.

We claim:

1. A method for determining a temperature of a semiconductor component with a memory cell having a transistor and a capacitor, the transistor having a controlled path between a source terminal and a drain terminal, the controlled path connecting a bit line to an electrode of the capacitor, which comprises:

determining a threshold voltage of the transistor and generating a signal in dependence on the threshold voltage of the transistor, the determining of the threshold voltage and generating of the signal step comprises:
determining a definition value for a gate voltage representing the threshold voltage of the transistor, a smaller value of the gate voltage than the definition value determines a first binary state of the memory cell and a larger value of the gate voltage than the definition value determines a second binary state of the memory cell, the second binary state having a value opposite to the first binary state, the determining of the definition value step comprises:
a) applying a bit line voltage to the bit line;
b) applying a given value for the gate voltage to a gate terminal of the transistor for a period of time for receiving a charge from the bit line and thereby setting a defined charge state in the capacitor;
c) removing the bit line voltage from the bit line after the period of time;
d) determining the charge state of the capacitor using a read-out circuit, the charge state representing either the first binary state or the second binary state;
e) repeating steps a)–d) using different values for the given value; and
f) generating the signal in dependence on the determined charge states for the different values of the given value; and determining a value for a temperature of the transistor in dependence on the signal.

2. The method according to claim, 1 which comprises:

determining a first signal in dependence on a first threshold voltage of the transistor and determining a first value for a first temperature of the transistor in dependence on the first signal at a first instant;

determining a second signal in dependence on a second threshold voltage of the transistor at a second instant; and defining a second value for a second temperature of the transistor at the second instant by way of the first signal, the second signal, the first value for the first temperature, and a temperature coefficient.

3. The method according to claim 1, which comprises determining a first definition value for the gate voltage for a first value of a first temperature of the transistor and determining a second definition value for the gate voltage for a second temperature of the transistor, wherein a value for the second temperature is determined by way of the first temperature, the first definition value, and the second definition value.

* * * * *